(12) United States Patent
Oakland et al.

(10) Patent No.: US 6,927,614 B2
(45) Date of Patent: Aug. 9, 2005

(54) HIGH PERFORMANCE STATE SAVING CIRCUIT

(75) Inventors: Steven F. Oakland, Colchester, VT (US); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,750

(22) Filed: Oct. 23, 2003

(65) Prior Publication Data

US 2005/0088213 A1 Apr. 28, 2005

(51) Int. Cl.[7] .............................................. H03K 3/289
(52) U.S. Cl. ...................... 327/202; 327/203; 327/210
(58) Field of Search ................................ 327/199–203, 327/210–212, 215–218; 365/145, 154, 156

(56) References Cited

U.S. PATENT DOCUMENTS

| | | | |
|---|---|---|---|
| 4,980,859 A * | 12/1990 | Guterman et al. | 365/185.08 |
| 5,327,566 A * | 7/1994 | Forsyth | 710/260 |
| 5,682,345 A * | 10/1997 | Roohparvar et al. | 365/185.04 |
| 5,813,035 A * | 9/1998 | McCoy et al. | 711/146 |
| 5,815,431 A * | 9/1998 | Chen | 365/145 |
| 5,844,422 A * | 12/1998 | Trimberger et al. | 326/38 |
| 5,986,962 A * | 11/1999 | Bertin et al. | 365/228 |
| 6,034,886 A * | 3/2000 | Chan et al. | 365/154 |
| 6,362,675 B1 * | 3/2002 | Alwais | 327/218 |
| 6,492,854 B1 | 12/2002 | Ku et al. | |
| 6,493,257 B1 | 12/2002 | Coughlin, Jr. et al. | |
| 6,650,158 B2 * | 11/2003 | Eliason | 327/203 |

* cited by examiner

*Primary Examiner*—Kenneth B. Wells
(74) *Attorney, Agent, or Firm*—Richard A. Henkler, Esq.; McGinn & Gibb, PLLC

(57) ABSTRACT

A state saving circuit includes a state saving latch powered by an un-interruptible power supply, and a cut-off control device powered by the un-interruptible power supply that selectively connects the state saving latch to a pair of latch nodes based upon a control signal. The control signal determines whether the state-saving latch is in one of a state saving mode and a state restoring mode.

20 Claims, 5 Drawing Sheets

HIGH PERFORMANCE STATE SAVING CIRCUIT

BACKGROUND OF INVENTION

1. Field of the Invention

The present invention generally relates to an integrated circuit, and more particularly to an integrated circuit having a high performance state saving circuit.

2. Description of the Related Art

With the increasing popularity of portable electronic devices, such as laptops, cell phones and personal digital assistants (PDAs), there is a growing need for systems that can reduce power consumption in order to extend energy storage times of the device's power supply (e.g., battery). Namely, applications that utilize CMOS integrated circuits (IC's) require circuits that utilize a minimal amount of power and have the capability to be powered down when not in use.

SUMMARY OF INVENTION

Many electronic devices, including systems having custom and application specific IC's (ASIC) feature some form of standby, sleep, or low power mode. These modes exhibit greatly reduced power dissipation by essentially disconnecting some of the logic in the device from the power supply when the logic is not required. Powering down portions of an IC can not only be used to save power and extend battery life, but can be used in certain schemes to manage chip power in systems operating from a standard power supply.

Recovery from sleep mode generally requires returning the IC to the state that it was in just prior to entering the sleep mode. However, without power, storage elements in an IC will lose their stored bits of information. Accordingly, for commonly used elements, such as data latches, the stored value in the latch must be maintained when the IC is switched to sleep mode and be restored after power-up. Accordingly, a need exists for circuitry that can save the state of a latch before power-down, and restore the state of the latch after power-up.

A CMOS state saving latch is described in U.S. Pat. No. 6,493,257 (incorporated herein by reference in its entirety) and is depicted in the FIG. 1. The CMOS state saving latch 100 includes clocking logic 102, a first level shifting latch 104 and a second level shifting latch 106. The clocking logic 102 receives a clock input C and a data input D. The clocking logic 102 and the second level shifting latch 106 use an interruptible power supply VDD and the first level shifting latch 104 uses an un-interruptible power supply VDDG.

The first level shifting latch 104 includes an input cut-off control which includes transistors 108 and 110 that are controlled by input FENCEN. The first level shifting latch 104 also includes a pair of cross-coupled inverters the first including a pair of transistors 112 and 114 and the second includes a pair of transistors 116 and 118.

The un-interruptible power supply VDDG always remains on or high. Accordingly, when the circuit 100 enters into a sleep mode, as when the power supply VDD is interrupted, the first latch stage 104 remains powered.

FENCEN is also powered by VDDG and remains high under normal operations so that data can freely flow into the first latch stage 104 via input transistors 120 and 122.

The second latch stage 106 is similar to the construction of the first latch stage 104. However, the second latch stage 106 is powered from the interruptible power supply VDD and uses a clock signal B to receive data from the first latch stage 104 and to pass data to output node L2.

Before the power supply VDD is powered down, clock C is held low to latch the state of the first latch stage 104. Next, the input cut-off control is activated, i.e. FENCEN is switched low, cutting off transistors 108 and 110. This isolates the cross-coupled inverters (i.e. transistors 112, 114, 116 and 118) from all the other devices in the circuit and stores the current state in the first latch stage 104. The interruptible power supply VDD may then be powered down to zero volts.

When the circuit 100 comes out of its power saving state, the interruptible power supply VDD is powered back up to its operating voltage. At this point, with FENCEN still low, the state of the first latch stage 104 can be transferred to the second latch stage 106 by pulsing the clock signal B, thereby restoring the state of the second latch stage 106. FENCEN may then be switched high and the first latch stage 104 can resume its normal mode of operation.

Alternatively, the clock signal C may be held low after the interruptible power supply VDD is powered up, then FENCEN may be brought high. The state of the first latch stage 104 can then be transferred to the second latch stage 106 by bringing the clock signal B high.

In both of these cases, the state of the FENCEN signal is irrelevant to the restoration of the signal. Rather, the state-saving latch 100 relies upon the state of the clock signal B to control restoration of the state.

Moreover, in either case, the CMOS state saving latch shown in FIG. 1, requires the use of two level shifting stages 104 and 106 and clock signal B. Thus, this CMOS state-saving latch 100 is delayed because of the necessity of going through the level shifting stages.

When the CMOS state saving latch 100 of FIG. 1 is compared to a high-performance D Flip flop 200 as shown in FIG. 2, it is clear that the state-saving latch has a performance problem.

The high-performance D Flip flop 200 also has two latching stages 202 and 204, but does not require input clocking logic, which might degrade the performance of the state-saving latch 100 when used as a D flip flop.

Further, in the high-performance D Flip flop 200, data D is driven with complementary CMOS devices, whereas in the state-saving latch 100, data is transferred into each latch through a single pull-down device, which further degrades the performance of a state-saving latch 100 when used as a D flip flop.

An exemplary embodiment of the present invention provides a single state-saving latch that can be added to any high-performance D flip flop or LSSD shift-register latch (SRL) with minimal impact to the performance of the D flip flop or LSSD SRL.

An exemplary embodiment of the inventive state-saving latch utilizes the same signal to control both the saving of the state and also the restoration of the state. In this manner, the present invention does not require a separate clock signal to restore the state of any attached device. Therefore, the inventive state-saving latch does not suffer from the delays of conventional state-saving latches and does not impact the responsiveness of any device, such as a high-performance D flip flop which may have its state restored from the state-saving latch of the present invention.

In view of the foregoing and other problems, drawbacks, and disadvantages of the conventional methods and structures, an exemplary feature of the present invention is to provide a method and structure in which the same signal controls the saving and restoring function of the state-saving latch.

In a first exemplary aspect of the present invention, a state saving circuit includes a state saving latch powered by an un-interruptible power supply, and a cut-off control device powered by the un-interruptible power supply that selectively connects the state saving latch to a pair of latch nodes based upon a control signal. The control signal determines whether said state-saving latch is in one of a state saving mode and a state restoring mode.

In a second exemplary aspect of the present invention, a high performance circuit includes a D flip flop powered by an interruptible power supply. The D flip flop includes a pair of latch nodes. The high performance circuit further includes a state saving latch powered by an un-interruptible power supply, and a cut-off control device powered by the un-interruptible power supply that selectively connects the state saving latch to the pair of latch nodes based upon a control signal. The control signal determines whether the state-saving latch is in one of a state saving mode for enabling the state saving latch to follow a state of the D flip flop and a state restoring mode for restoring the state of said D flip flop from the state saving latch.

In a third exemplary aspect of the present invention, a high performance circuit includes an application specific integrated circuit powered by an interruptible power supply which includes a pair of latch nodes, a state saving latch powered by an un-interruptible power supply, and a cut-off control device powered by the un-interruptible power supply that selectively connects the state saving latch to the pair of latch nodes based upon a control signal. The control signal determines whether the state-saving latch is in one of a state saving mode for enabling the state saving latch to follow a state of the application specific integrated circuit and a state restoring mode for restoring the state of the application specific integrated circuit flop from the state saving latch.

An exemplary embodiment of the invention is advantageous because input clocking logic is not required and, therefore, the performance of the inventive state-saving latch does not degrade the performance of any device in communication with the state-saving latch.

An exemplary embodiment of the present invention is advantageous because the inventive state-saving latch uses the same signal to control both the saving of the state and the restoration of the state. Therefore, this exemplary embodiment does not require a separate clock signal to restore the state of any attached device and does not suffer from the delays of conventional state-saving latches and further, does not impact the responsiveness of any device that may have its state restored from the state-saving latch of the present invention.

BRIEF DESCRIPTION OF DRAWINGS

The foregoing and other exemplary purposes, aspects and advantages will be better understood from the following detailed description of an exemplary embodiment of the invention with reference to the drawings, in which.

DETAILED DESCRIPTION

Figure 1:
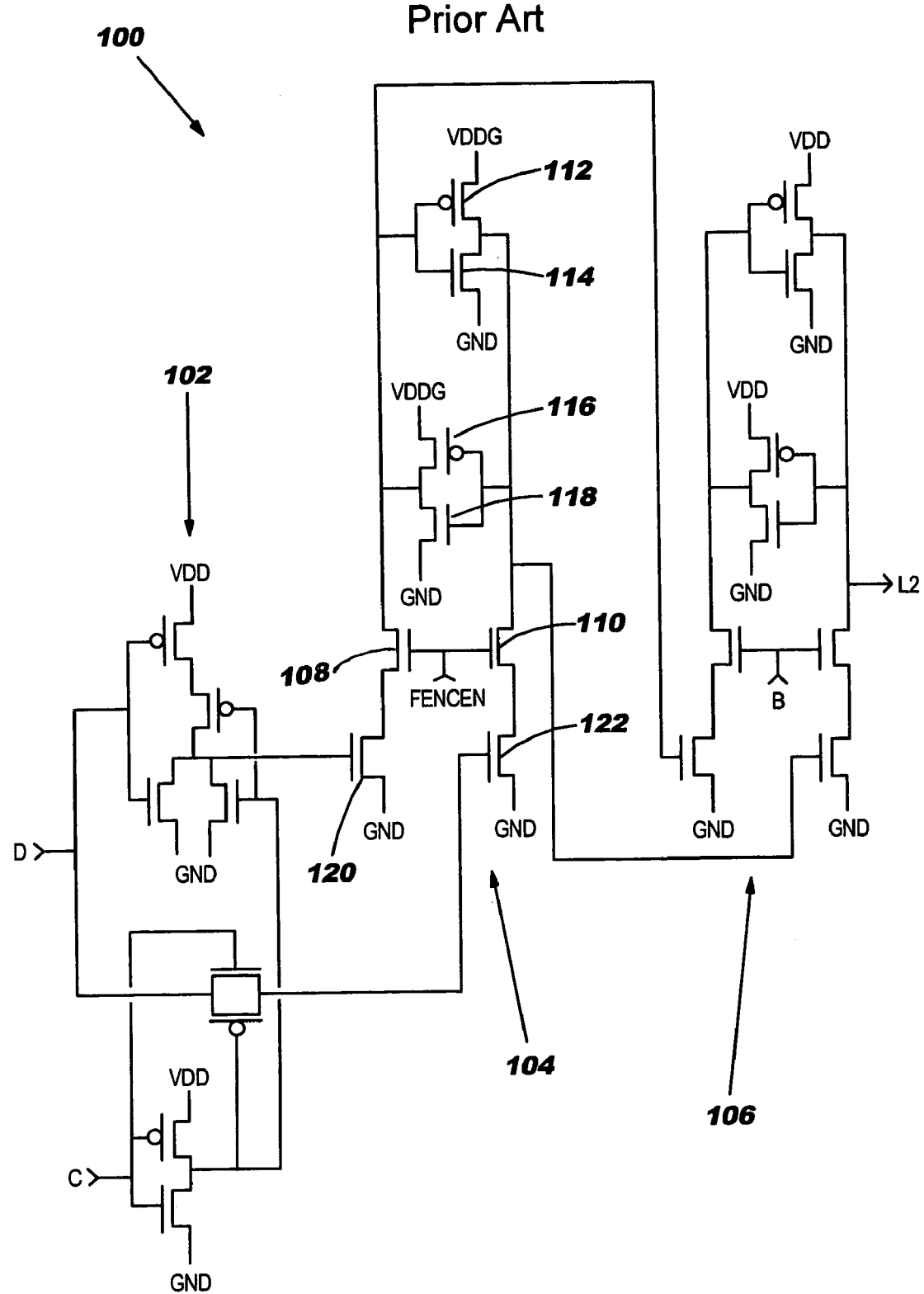
FIG. 1 shows a conventional CMOS state saving latch 100.
Figure 2:
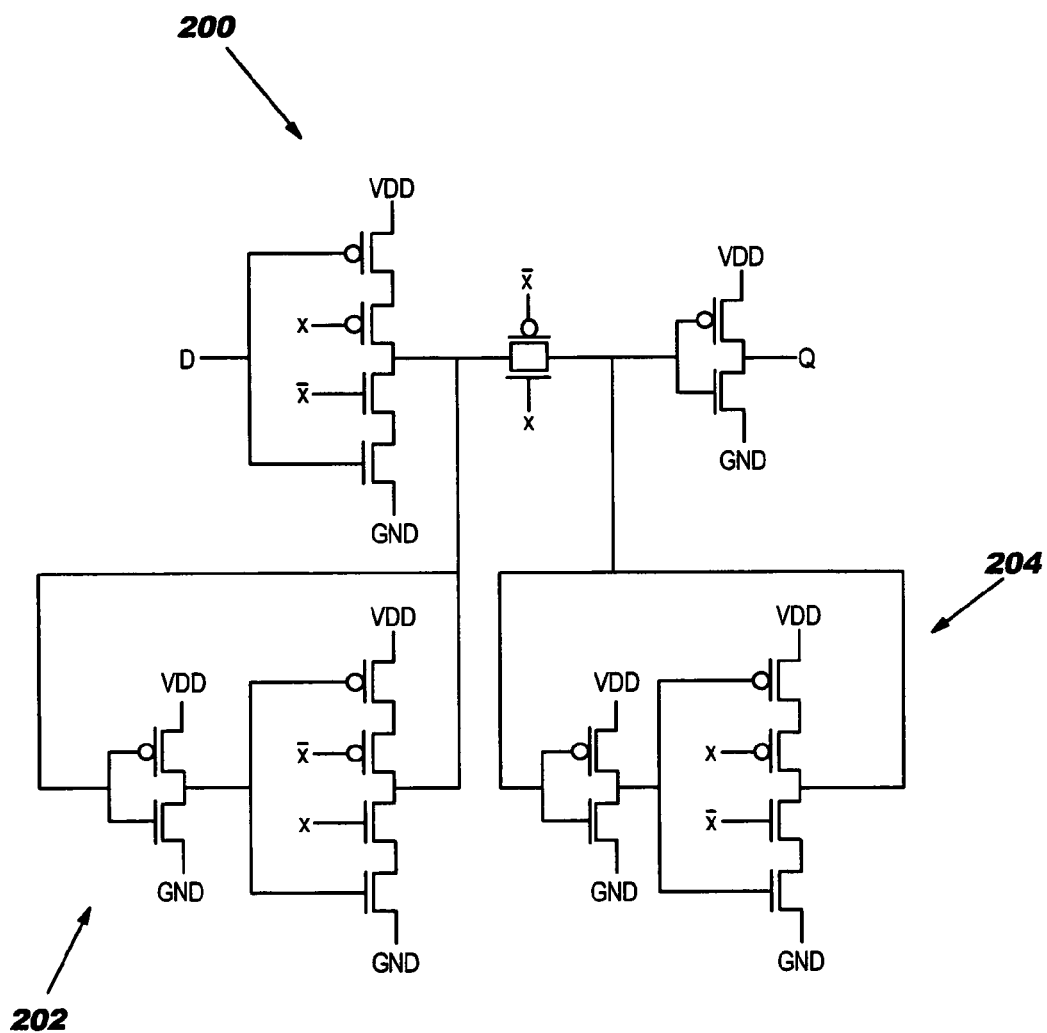
FIG. 2 shows a conventional high-performance D Flip flop 200.

Referring now to the drawings, and more particularly to FIGS. 1–5, there are shown exemplary embodiments of the method and structures according to the present invention.

Figure 3:
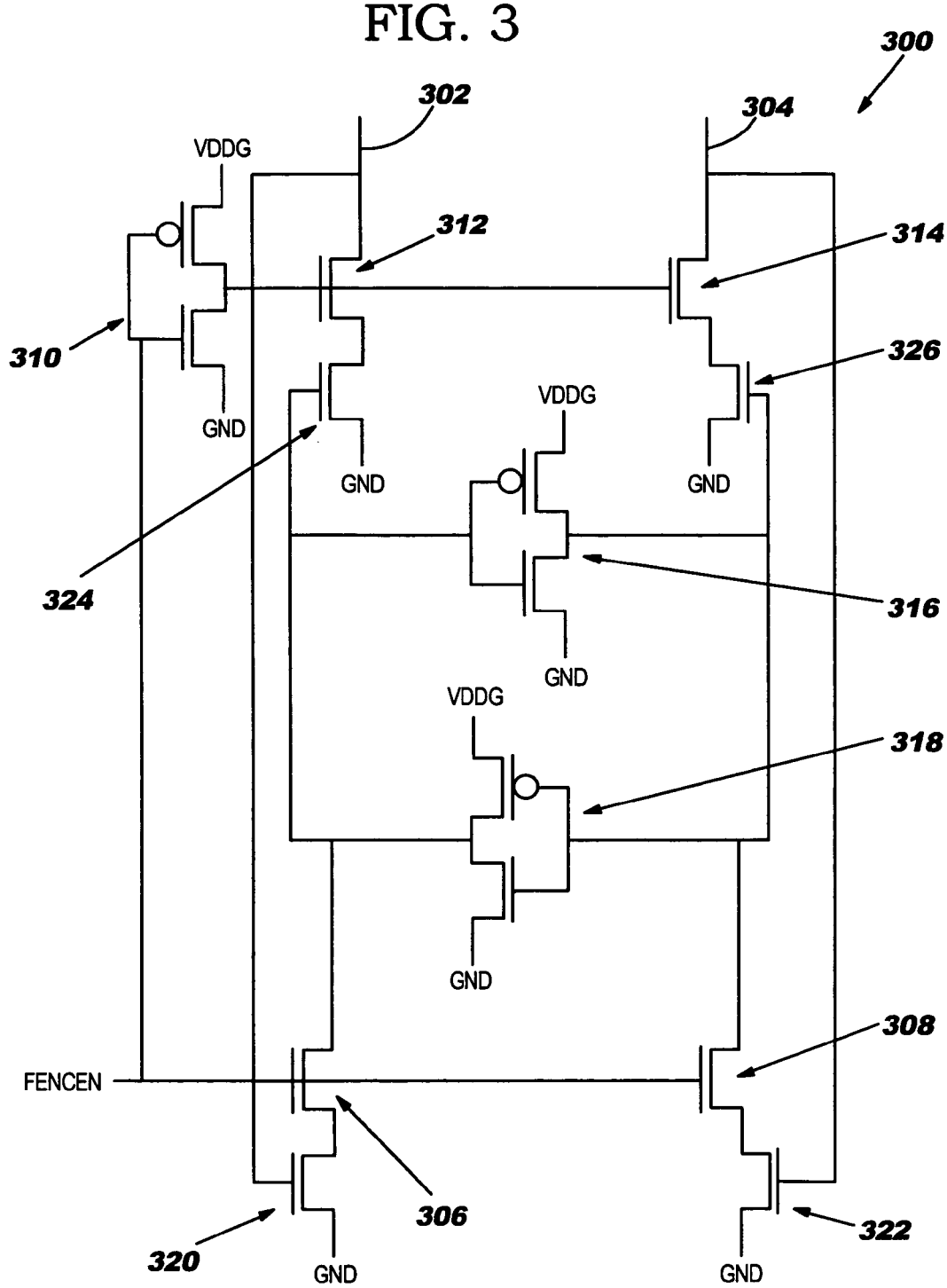
FIG. 3 shows an exemplary embodiment of a high performance state saving latch 300 in accordance with the present invention.

FIG. 3 illustrates one exemplary embodiment of a high performance state saving latch 300 in accordance with the present invention. The high performance state saving latch 300 includes a True node 302 and a Complement node 304 which may be connected to a D flip-flop 400 as shown, for example, in FIG. 4.

The high-performance state saving latch 300 includes a cut-off control that includes CMOS transistor pair 310 and transistors 306, 308, 312, and 314 that are controlled by input FENCEN. CMOS transistor pair 310 (also known as an inverter) and state saving CMOS transistor pairs 316 and 318 use un-interruptible power supply VDDG.

Figure 4:
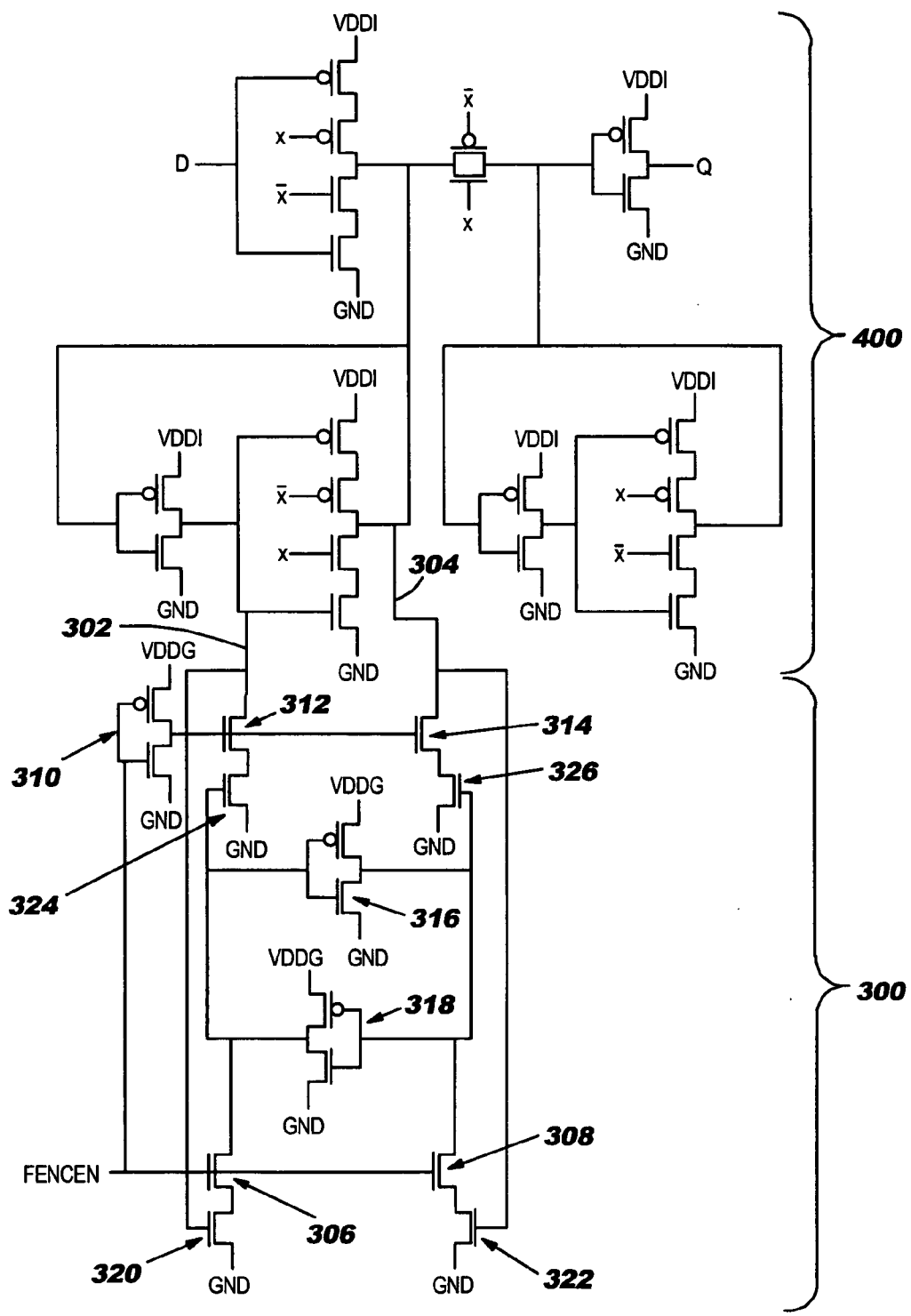
FIG. 4 shows the high performance state saving latch 300 connected to a D flip-flop 400.

In FIG. 4, the D flip flop 400 uses interruptible power supply VDDi.

For normal operation, FENCEN is held high and the state of the D flip flop 400 is copied into the state-saving latch because transistors 306 and 308 are enabled. In other words, as the state of the D flip flop 400 changes, the state of the state-saving latch 300 also changes.

More particularly, for example, if true node 302 is high, then transistor 320 is turned on. Since FENCEN is also high and transistor 306 is turned on, the input to cross-coupled inverter 316 is pulled to ground GND. Thus, the output of cross-coupled inverter 316 goes high, and causes the output of cross-coupled inverter 318 to be held low. Further, while the output of the cross-coupled inverter 316 is high which turns on transistor 326, the complement node is isolated from ground GND through the transistor 326 because transistor 314 is held off by the inverted FENCEN signal.

Therefore, under normal operation, since FENCEN is held high, then the output of the inverter 310 is low, which turns off transistors 312 and 314 which enables the cross coupled inverters 316 and 318 to follow the signals input on nodes 302 and 304.

If, on the other hand, FENCEN is brought low, then transistor devices 306 and 308 are turned off and the output of inverter 310 becomes high which in turn turns transistors 312 and 314 on, enabling the state-saving latch to drive one of the true and complement nodes 302 and 304 low.

Further, if FENCEN is high and the clock signal X is stopped, then there is no change in state in the D flip flop 400 and, if FENCEN is brought low while the clock signal X is stopped, then there is no change in state. Even if the D flip flop's power supply VDDi is switched off while FENCEN is held low, the state-saving latch 300 retains the state because it is powered by un-interruptible power supply VDDG.

When the interruptible power supply VDDi is turned on, the latch within the D flip flop 400 is powered up in the same state as the state-saving latch 300. Either the true node 302 or the complement node 304 of the latch within the D flip flop 400 is pulled to ground through one N-channel device that is enabled when FENCEN is low and through a second N-channel device that is enabled depending on the state stored in the state-saving latch.

If FENCEN is brought high while the clock signal X is off, then there will be no change in state. Normal operation is resumed by starting the clock signal X.

The CMOS devices 310, 316 and 318 are preferably constructed using high threshold voltage devices, where the "high" threshold voltage is in the upper end of the practical range for the technology. Thereby ensuring that leakage current through these devices 310, 316 and 318 is minimized.

Lower-voltage threshold devices typically result in larger "on" currents which may be important for performance. However, "off" (or leakage) currents increase exponentially with reductions in threshold voltage, which can significantly increase power consumption.

As an example a device with a 0.15 Volt threshold might deliver 50% more "on" current than a comparable device with a 0.35 Volt threshold, but may have 400 times more "off" (leakage) current than the lower threshold device. Therefore, high threshold voltage devices are very attractive for applications where leakage current and power consumption are important, but performance is less critical.

To minimize active power in the state-saving latch, the device sizes of the cross-coupled inverters can be minimized. Alternatively, the un-interruptible power supply VDDG can be turned off during normal operation, and turned on only to save state.

Figure 5:
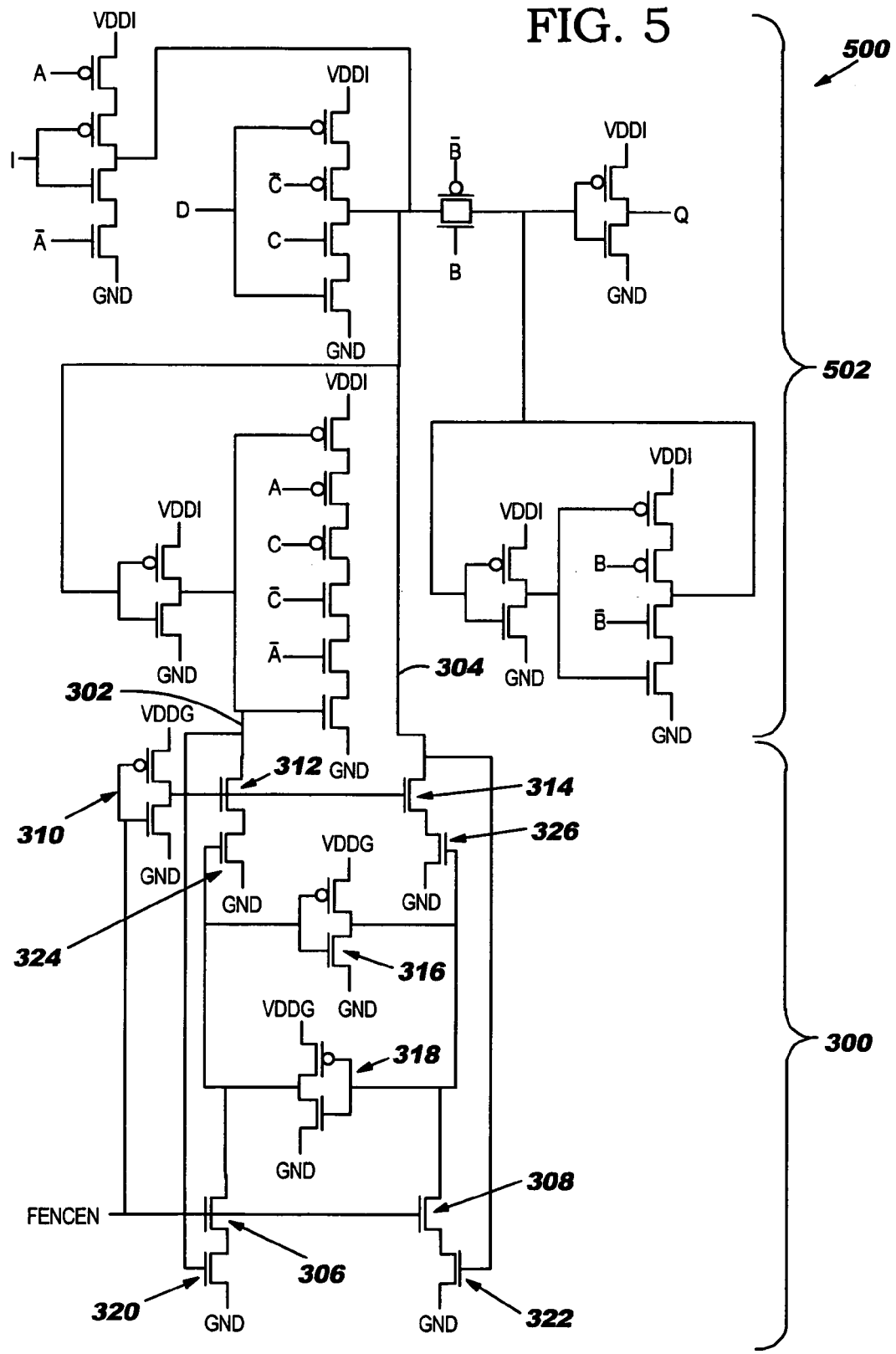
FIG. 5 shows the high-performance state saving latch 300 connected to an ASIC latch 500.

Further, FIG. 5 shows the high-performance state saving latch 300 in use in an ASIC latch 500. The ASIC latch 500 includes the additional devices 502 to make a fully level sensitive scan design (LSSD) compatible latch.

While the exemplary embodiments of the present invention described above have been described for use with a D flip flop 400 or in an LSSD compatible latch, those skilled in the art will recognize that the present invention may also be used with other devices.

While the invention has been described in terms of several exemplary embodiments, those skilled in the art will recognize that the invention can be practiced with modification.

Further, it is noted that, Applicant's intent is to encompass equivalents of all claim elements, even if amended later during prosecution.

What is claimed is:

1. A state saving circuit comprising:
   a first latch capable of performing a desired operation;
   a second latch capable of saving the state of the first latch and of restoring the state of the first latch upon the powering up of the first latch, the second latch being powered by a power supply, wherein a control signal determines whether said second latch is in one of a state saving mode and a state restoring mode.

2. The state saving circuit of claim 1,
   wherein said power supply comprises an un-interruptible power supply; and
   further comprising a cut-off control device powered by the un-interruptible power supply that selectively connects the second latch to a pair of latch nodes based upon said control signal.

3. The circuit of claim 1, further comprising a cut-off control device powered by the un-interruptible power supply that selectively connects the second latch to a pair of latch nodes based upon said control signal.

4. The circuit of claim 1, wherein the second latch comprises a pair of cross coupled inverters.

5. A state saving circuit comprising:
   a state saving latch powered by an un-interruptible power supply; and
   a cut-off control device powered by the un-interruptible power supply that selectively connects the state saving latch to a pair of latch nodes based upon a control signal, wherein the control signal determines whether said state-saving latch is in one of a state saving mode and a state restoring mode.

6. The state saving circuit of claim 5, wherein said state saving latch comprises a pair of cross coupled inverters.

7. The state saving circuit of claim 6, wherein the pair of cross coupled inverters comprise a pair of CMOS inverters.

8. The state saving circuit of claim 5, wherein said cut-off control device disconnects the state saving latch from the pair of latch nodes when the control signal has a predetermined low value.

9. The state saving circuit of claim 5, wherein said cut-off control device comprises a CMOS inverter.

10. The state saving circuit of claim 9, wherein said cut-off control device further comprises a pair of transistors each having a gate in communication with an output of the CMOS inverter.

11. The state saving circuit of claim 5, wherein said state saving latch comprises a CMOS inverter.

12. The state saving circuit of claim 5, wherein the latch nodes comprise a true latch node and a complement latch node.

13. The state saving circuit of claim 5, wherein the cut-off control device comprises:
    an inverter receiving said control signal, that inverts said control signal and provides said inverted control signal to gates of a first pair of transistors; and
    a second pair of transistors receiving said control signal at the gates of said second pair of transistors.

14. The state saving circuit of claim 13, wherein said latch nodes comprise a true node and a complement node.

15. The state saving circuit of claim 14, wherein one of said first pair of transistors is connected to said true node and the other of said first pair of transistors is connected to said complement node.

16. The state saving circuit of claim 13, wherein said state saving latch comprises a pair of cross coupled inverters.

17. The state saving circuit of claim 16, further comprising a third pair of transistors selectively connecting said first pair of transistors to a ground based upon input gate signals from said pair of cross-coupled inverters.

18. The state saving circuit of claim 16, further comprising a third pair of transistors selectively connecting said second pair of transistors to a ground based upon input gate signals from a said pair of cross-coupled inverters.

19. A circuit, comprising:
    a D flip flop powered by an interruptible power supply and comprising a pair of latch nodes;
    a state saving latch powered by an un-interruptible power supply; and
    a cut-off control device powered by the un-interruptible power supply that selectively connects the state saving latch to said pair of latch nodes based upon a control signal;
    wherein the control signal determines whether said state-saving latch is in one of a state saving mode for enabling said state saving latch to follow a state of said D flip flop and a state restoring mode for restoring the state of said D flip flop from said state saving latch.

20. A circuit, comprising:
    an application specific integrated circuit powered by an interruptible power supply and comprising a pair of latch nodes;
    a state saving latch powered by an un-interruptible power supply; and a cut-off control device powered by the un-interruptible power supply that selectively connects the state saving latch to said pair of latch nodes based upon a control signal;

wherein the control signal determines whether said state-saving latch is in one of a state saving mode for enabling said state saving latch to follow a state of said application specific integrated circuit and a state restoring mode for restoring the state of said application specific integrated circuit from said state saving latch.

* * * * *